(12) United States Patent
Zadesky

(10) Patent No.: US 8,397,977 B2
(45) Date of Patent: Mar. 19, 2013

(54) SOLDER CONTAINMENT BRACKETS

(75) Inventor: Stephen P. Zadesky, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/528,730

(22) Filed: Jun. 20, 2012

(65) Prior Publication Data

US 2012/0255768 A1 Oct. 11, 2012

Related U.S. Application Data

(62) Division of application No. 12/571,295, filed on Sep. 30, 2009, now Pat. No. 8,210,422.

(51) Int. Cl.
*B23K 31/02* (2006.01)
*H01L 23/48* (2006.01)
*H01L 29/41* (2006.01)

(52) U.S. Cl. ............ 228/180.5; 257/734; 257/773; 257/779

(58) Field of Classification Search .................. None
See application file for complete search history.

(56) References Cited

U.S. PATENT DOCUMENTS

| | | | |
|---|---|---|---|
| 4,840,924 A * | 6/1989 | Kinbara | 430/314 |
| 5,046,957 A | 9/1991 | Millhimes | |
| 5,541,367 A | 7/1996 | Swamy | |
| 5,948,175 A | 9/1999 | Glenn | |
| 6,091,155 A | 7/2000 | Jonaidi | |
| 6,227,867 B1 | 5/2001 | Chen et al. | |
| 6,251,766 B1 | 6/2001 | Desai et al. | |
| 6,295,709 B1 | 10/2001 | Klein | |
| 6,417,088 B1 | 7/2002 | Ho et al. | |
| 6,437,669 B1 | 8/2002 | Welstand et al. | |
| 6,442,832 B1 | 9/2002 | Noble | |
| 6,722,558 B2 | 4/2004 | Smith et al. | |
| 6,867,504 B2 | 3/2005 | Lichtenwalter et al. | |
| 7,957,155 B2 | 6/2011 | Kent et al. | |
| 2004/0078964 A1 | 4/2004 | Itou et al. | |
| 2005/0274959 A1 | 12/2005 | Kim et al. | |
| 2008/0023845 A1 | 1/2008 | Hougham et al. | |

FOREIGN PATENT DOCUMENTS

| | | | |
|---|---|---|---|
| JP | 56-055066 | | 5/1981 |
| JP | 01-007692 A | * | 1/1989 |
| JP | 06-053271 | | 2/1994 |
| JP | 2004-363216 A | * | 12/2004 |
| JP | 2006-202881 A | * | 8/2006 |

OTHER PUBLICATIONS

Derwent-ACC-No. 1994-060681 which corresponds to JP-6-13740A (published Jan. 1994).*
Derwent-ACC-No. 1988-281709 which corresponds to JP-63-205995A (published Aug. 1988).*

* cited by examiner

*Primary Examiner* — Kiley Stoner
(74) *Attorney, Agent, or Firm* — Treyz Law Group; Jason Tsai

(57) ABSTRACT

Electronic assemblies with solder containment brackets are provided. A solder containment bracket may have a planar base and a vertically extending wall. The wall may protrude upwards from the base to form an enclosed region. The base may have a hole that corresponds to the shape of the enclosed region. The wall may have an opening. A wire may be inserted into the opening. The wire may be soldered to the solder containment bracket to form a solder joint that electrically connects the wire to the bracket. The solder joint formed within the enclosed region may have a size that is defined by the bracket wall. The solder containment bracket may be soldered to a solder pad on a printed circuit board by reflowing a layer of solder paste.

12 Claims, 17 Drawing Sheets

SOLDER CONTAINMENT BRACKETS

This application is a division of patent application Ser. No. 12/571,295, filed Sep. 30, 2009, now U.S. Pat. No. 8,210,422 which is hereby incorporated by referenced herein in its entirety. This application claims the benefit of and claims priority to patent application Ser. No. 12/571,295, filed Sep. 30, 2009.

BACKGROUND

This invention relates to solder joints, and more particularly, to solder containment structures that facilitate formation of satisfactory solder joints.

Electronic devices include electrical components such as resistors, capacitors, inductors, switches, light-emitting diodes, speakers, microphones, displays, integrated circuits, wires, connectors, and batteries. These electrical components are typically attached to a printed circuit board (PCB). The printed circuit board may, in turn, be mounted within the electronic device.

Some electrical components are attached to printed circuit boards using through-hole mounting techniques. This type of mounting technique is suitable for electrical components that have pins. The pins of an electrical component may be inserted into through-holes in a printed circuit board. For example, an electrical component may be attached onto a top surface of a printed circuit board so that its pins pass through corresponding through-holes. On the backside of the printed circuit board, the pins may protrude from the holes. Solder may be applied to the protruding end of the pin to electrically connect the pin to a solder pad that surrounds the protruding end of the pin. Solder joints form electrical connections between the electrical component and the solder pad and other traces on the printed circuit board.

Through-holes may consume undesirably large amounts of board area. For example, the presence of protruding backside pins may reduce backside mounting opportunities.

Another method of attaching electrical components to a printed circuit board involves the use of surface-mount technology (SMT) and SMT components. SMT mounting techniques involve the mounting of electronic components directly onto the surface of a printed circuit board. SMT techniques do not require the use of through-holes and may allow mirrored components to be placed on both surfaces of the printed circuit board (e.g., one component may be placed on the bottom surface directly below another component that is placed on the top surface).

In a typical SMT arrangement, a printed circuit board has solder pads that serve as landings for corresponding SMT contacts (leads) on an SMT component. Solder may be applied to the solder pads to form solder joints for the SMT component.

The use of these SMT mounting schemes may be suitable for mounting SMT parts to printed circuit boards. Other types of components may need to be connected differently. For example, batteries are often provided with wire leads. These leads may need to be soldered to solder pads on a printed circuit board. Unless care is taken, however, the solder joints that are used in connecting the wires to the printed circuit board may consume undesirably large amounts of area or may intrude into the space reserved for nearby components giving rise to potential component damage. A poorly formed solder joint might also contain insufficient solder, leading to an incomplete or unreliable connection.

It would therefore be desirable to be able to provide improved ways in which to form solder joints such as solder joints involved in soldering wires to solder pads on printed circuit boards.

SUMMARY

Electronic assemblies may be provided with solder containment brackets. An electronic assembly may include a substrate such as a rigid or flexible printed circuit board (PCB). Electrical components may be attached to the circuit board using surface-mount technology (SMT) mounting techniques. These SMT mounting techniques may involve the formation of land patterns on a printed circuit board. The land patterns serve as mounting areas on which electrical components may be placed. Land patterns may be formed from solder paste deposited on top of solder pads. Traces on the circuit board may form electrical connections to the solder pads.

A solder containment bracket may be placed on top of the land pattern (e.g., on one of the solder pads). The solder containment bracket may be constructed from a thin piece of metal having a base and a wall. The base may be formed from a planar metal member in the shape of the land pattern. For example, the base may have a rectangular outline that matches the rectangular outline of a solder pad. The wall of each solder containment bracket may protrude upwards from the base to form a dam-like structure that surrounds a central enclosed solder region. There may be one or more openings in the wall. A bare wire segment (e.g., the stripped end of an insulated length of wire) may be inserted into the opening. Solder may be applied into the region that is surrounded by the wall to form an electrical connection between the wire and the solder containment bracket.

The solder containment bracket may help control the area and the height of the solder joint that is formed within the enclosed region defined by the bracket wall. A well-controlled solder joint may provide a more reliable electrical connection for electrical components mounted on the surface of a circuit board. The use of the solder containment bracket may also facilitate the formation of solder connections and may thereby ease assembly operations.

Further features of the invention, its nature and various advantages will be more apparent from the accompanying drawings and the following detailed description.

DETAILED DESCRIPTION

Figure 1:
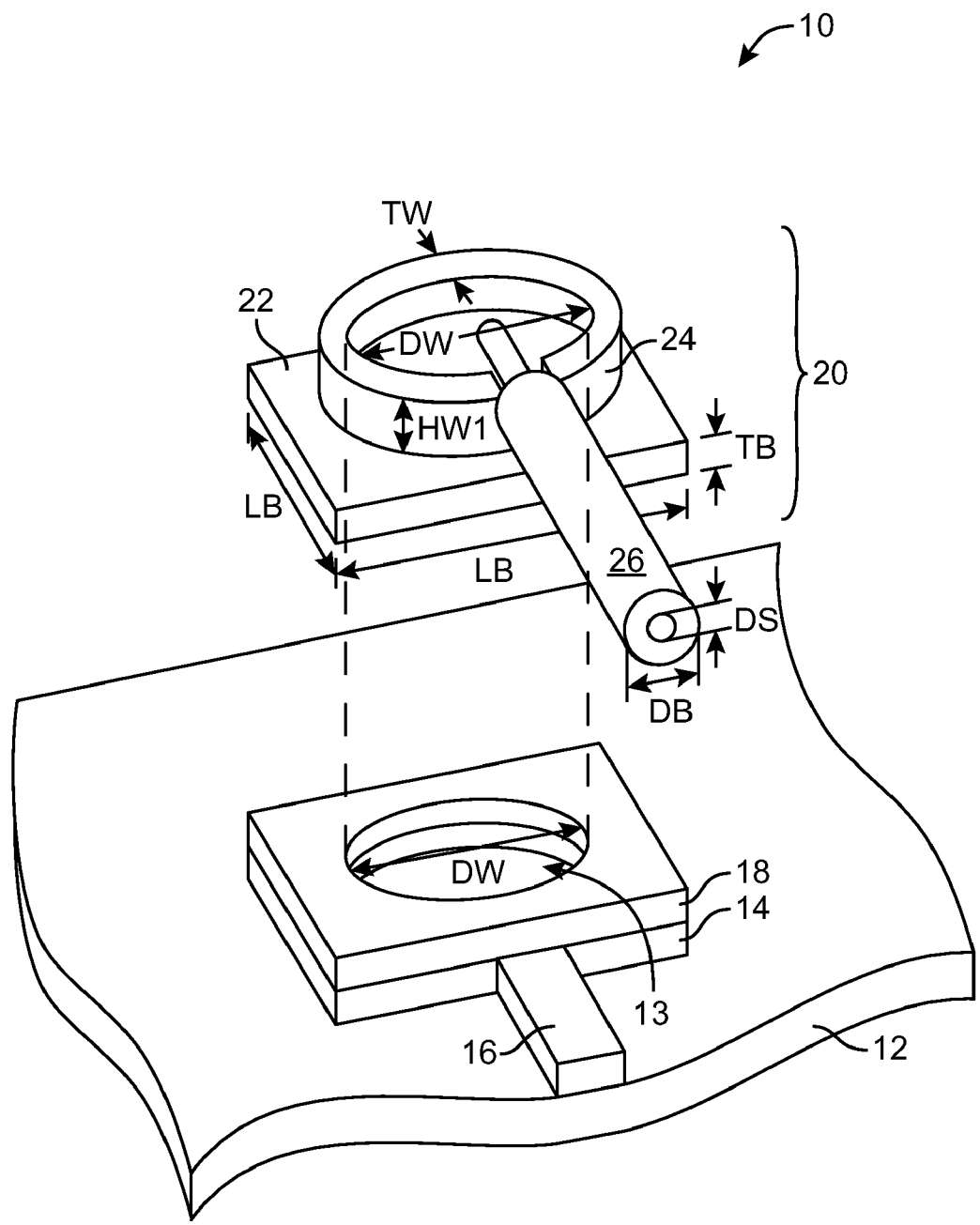
FIG. 1 is a perspective view of an illustrative solder containment bracket, printed circuit board with a corresponding solder pad, and wire that is to be soldered to form a solder joint within an enclosed portion of the solder containment bracket in accordance with an embodiment of the present invention.

Electronic devices may include electrical components. These electrical components may include, for example, discrete components, integrated circuits, wires, batteries, etc.

Wires may be used to interconnect components. For example, a battery may have wire leads that are soldered to a printed circuit board. Wires may also be associated with other components. Each wire may be formed from a single cylindrical strand of metal (solid wire) or a collection of wire filaments (filamented wire).

Wires may be bare (uninsulated at any point along their lengths) or may be insulated. An insulated wire may have an inner conductive core surrounded by an insulating material such as plastic that shields the inner core.

Electrical components may have electrical connectors (e.g., electrical pins or wire leads) that may be used to make electrical contacts with other components. Electrical components may be attached to a piece of substrate. The substrate may be a printed circuit board such as printed circuit board 12 of FIG. 1. Circuit board 12 may be used to provide mechanical support and may be used as a medium through which the electrical components that are attached to the circuit board may be electrically connected to one another. Circuit board 12 may be a rigid printed circuit board (e.g., a printed circuit board formed from fiberglass-filled epoxy) or may be a flexible printed circuit board (a flex circuit formed from a sheet of flexible polymer such as a sheet of polyimide).

The substrate material for printed circuit board 12 is preferably dielectric. Conductive traces such as traces of copper, gold, copper plated with gold, tin, nickel, or other suitable conductive materials may be used to form solder pads and interconnects on circuit board 12.

Circuit board 12 may have a top surface and a bottom surface. The top and bottom surfaces may be planar and may be parallel to each other. Circuit board 12 may be a single layer board or a multilayer board. In a scenario in which circuit board 12 is a multilayer board, there may be multiple layers of conductive traces formed between the top and bottom surfaces. Vias may be used to interconnect traces in different layers.

Electrical components and solder brackets may be attached to circuit board 12 using surface-mount technology (SMT) mounting techniques. SMT mounting techniques may involve direct attachment of electrical components or solder bracket to the surfaces of a printed circuit board substrate. Electrical components may be mounted to the top surface and the bottom surface of a given circuit board. Surface-mount technology may be used in addition to or instead of using through-hole mounting arrangements. Through-hole component mounting technology may involve drilling through-holes into the printed circuit board.

Electrical components mounted using surface-mount technology (e.g., SMT components) are typically smaller than their through-hole counterparts. SMT components may, for example, have smaller contacts (e.g., short pins or contact pads).

Much effort has been spent by the semiconductor fabrication industry to minimize the dimensions of transistors on an integrated circuit. Minimizing the dimensions of transistors allow more transistors to be packed per square area on a given chip, thereby lowering the fabrication costs. Similarly, it may be desirable to pack electrical components as densely as possible on a circuit board. Thus, the surface-mount technology may replace the through-hole technology if cost and size are of concern. Surface-mount technology may therefore be used for electronic assemblies in mobile devices. As mobile devices become smaller and smaller, devices may require electrical components attached to a circuit board within the mobile device to be placed closer and closer together.

In the example of FIG. 1, solder containment bracket 20 is being mounted to a mating solder pad on printed circuit board 12 using SMT mounting techniques. In this context, solder containment bracket 20 may serve as an SMT component. In order for SMT components such as bracket 20 to make an electrical connection to circuit board 12, solder pad 14 may be formed on the top surface of circuit board 12. In a typical layout, solder pad 14 may have a square or rectangular shape. Solder pad 14 may, in general, have curved or straight edges and may form any suitable polygonal shape. Solder pad 14 may have a hole in its center such as hole 13 of FIG. 1. The hole may be circular or may have other suitable shapes. In the example of FIG. 1, hole 13 is circular and has a diameter DW. Solder pad 14 may be a thin conductive trace formed on the surface of printed circuit board 12. For example, solder pad 14 may be a trace of copper. In the FIG. 1 example, solder pad 14 has hole 13, but circuit board 12 does not have a corresponding opening (i.e., the surface of board 12 is be solid under hole 13 in pad 14).

Solder pad 14 may be connected to trace 16. Trace 16 may be a conductive pathway formed using the same materials as solder pad 14. Trace 16 may be routed elsewhere on circuit board 12 to make electrical connections with other electrical components. Any area on the surfaces of circuit board 12 that is not occupied by a solder pad, trace, or other metal structure may be covered by a solder resist coating. The solder resist coating may be formed form a polymer and may act like a solder mask that prevents solder from forming on the solder resist coating outside the solder pad areas. This helps prevent undesirable short circuit paths from forming between separate conductors. The solder resist coating may also provide insulation and protection from the outside environment.

Solder paste 18 may be formed on top of solder pad 14. The combination of solder pad 14 and solder paste 18 is sometimes referred to as a land pattern and serves as a mounting structure or solder pad attachment structure that allows solder containment bracket 20 or an electrical component to be attached to circuit board 12. Solder paste 18 may be used to temporarily hold onto the electrical contact of a structure that is being mounted during the SMT process.

Solder paste 18 may be applied to circuit board 12 using a stencil. Any suitable method of screen printing and dispensing solder paste 18 on top of solder pad 14 may be used, if desired. Solder paste 18 may include powdered metal solder mixed with flux. The solder paste may include an alloy of tin, lead, and a suitable tertiary metal (as an example). Lead-free solder may also be used. Flux is a thick medium that can act as a temporary adhesive that holds the components down until the actual soldering process is performed. Flux may be used to prevent oxidation of solder. Tin-lead solder, for example, may attach well to the copper of solder pad 14 but not to various oxides of copper. Copper may oxidize readily at soldering temperatures. Flux is a strongly reducing substance at soldering temperatures and can be used to prevent formation of metal oxides (e.g., prevent copper from oxidizing during soldering operations). Flux may also act as a wetting agent in the soldering process to help reduce the surface tension of the melted solder, allowing the solder to better wet out the parts to be joined. A low level of oxidation may be helpful in producing a high-quality solder joint.

Solder paste 18 may have an opening that corresponds to the hole in solder pad 14. The opening in solder paste 18 may have a diameter of DW that matches the diameter of hole 13 in pad 14. Solder paste 18 may cover solder pad 14 entirely (as shown in FIG. 1) or may only partly cover solder pad 14.

Conventionally, an electrical component such as a wire lead of a battery may be directly soldered to a solder pad. The size of a traditional solder pad tends to be large. In addition, the conventional method of soldering a wire directly to a solder pad makes it difficult to precisely control the size of the solder joint, leading to a potentially unreliable connection and unpredictably sized solder bond.

As shown in FIG. 1, electronic assembly 10 may include solder containment bracket 20 mounted on top of a land pattern (e.g., solder paste 18 and solder pad 14) that is formed on a surface of circuit board 12. Wire 26 may be inserted into bracket 20 and soldered to bracket 20 to form an electrical connection to solder pad 14.

Solder containment bracket 20 may be used to control the size of the solder joint to provide a more reliable solder bond. Bracket 20 may be formed from stainless steel, copper, or other metals (as examples). If desired, bracket 20 may be plated (e.g., by coating a copper inner structure with a layer of gold, nickel, tin, or other metals to ensure low oxidation and low-resistance contact formation and to help with solder adhesion). Solder pad 14 may also be plated. If desired, bracket 20 may be plated using the same materials used in plating solder pad 14.

Solder containment bracket 20 may include base 22 and wall 24. Base 22 may be a thin piece of metal that has thickness TB. Base 22 may have a square outline with base lengths LB on each side. Base 22 may be rectangular or any polygonal shape, if desired. When placed on top of solder paste 18, base 22 may only cover part of solder paste 18. Base 22 may have a base hole that corresponds to the hole of solder pad 14. The base hole may be circular and have a diameter DW.

Wall 24 may protrude upwards from base 22 and surround the base hole. The shape of wall 24 should correspond to the shape of the base hole. In this example, wall 24 forms an enclosed solder region (e.g., a circular dam) that may have a diameter DW. Wall 22 may extend perpendicularly upwards from the plane of base 22 by a wall height HW1. Wall 24 may have a wall thickness TW. If desired, wall thickness TW may be the same as base thickness TB for ease of manufacturing. The sum of the values of diameter DW and two times that of wall thickness TW may be less than the base length LB. Wall 24 may be formed within the borders of base 22.

Wall 22 may have an opening or notch (e.g., see, FIG. 1). The wall opening may allow an electrical contact terminal such as a terminal of wire 26 to be inserted. Wire 26 may be a single cylindrical string of metal or multiple filaments of metal and may be used to carry power or data signals. Wire 26 may have an inner conductive core surrounded by an insulating material. The conductive core may be formed from platinum, silver, iron, copper, aluminum, gold, or any suitable metal that conducts electricity. In a scenario in which a copper wire is used, the copper conductive core may be plated with other metals, such as tin, nickel, and silver to help handle different temperatures. The insulating material (e.g., insulating cover) that surround the conductive core may be formed from plastic, polymers, varnish, or any suitable dielectric material that can insulate the conductive core from outside interference. The conductive core may be a solid-core (e.g., single-stranded wire) that can carry one electrical signal or a stranded wire (e.g., a bundle of small-gauge wires) that can carry multiple electrical signals. Wire 26 may be a stranded wire. The stranded wire may be more flexible (at the price of increased cost) and may allow repeated bending to allow for connections between small electrical components on a circuit board or between circuit boards in multi-circuit-board devices.

Wire 26 may be a thin wire with any suitable gauge index. Wire 26 may provide adequate electrical connection between electrical components on circuit board 12 to allow proper functional usage. The inner conductive core of wire 26 may have a diameter DS. The entire wire 26 including the conductor core and the insulating cover may have a diameter DB. Diameter DB may be greater than diameter DS. In a scenario in which only the conductive core of wire 26 is to be inserted into the opening of wall 24, the opening of wall 24 may be at least larger than DS. The opening of wall 24 may be at least larger than DB, if desired. Wire 26 may be stripped (e.g., have a segment of the insulating cover removed from the wire) to expose a portion of the conductive core that may be inserted into the region surrounded by wall 24. Wire 26 may be routed to another circuit component such as an integrated circuit or connected to any other electrical component on circuit board 12 or another circuit board in the case of multi-circuit-board devices.

Wall 24 of bracket 20 may provide improved control of solder flow and the area of the solder joint (e.g., solder is well controlled within the confines of wall 24 in the X-Y plane direction that is parallel to the surface of circuit board 12). A well-managed solder joint using bracket 20 may provide a more reliable electrical connection and may be smaller than a through-hole wire connection that is used in conventional through-hole technology. In electronic assembly 10, the base hole of solder containment bracket 20 and the hole of the land pattern may be aligned to form a proper landing.

Figure 2:
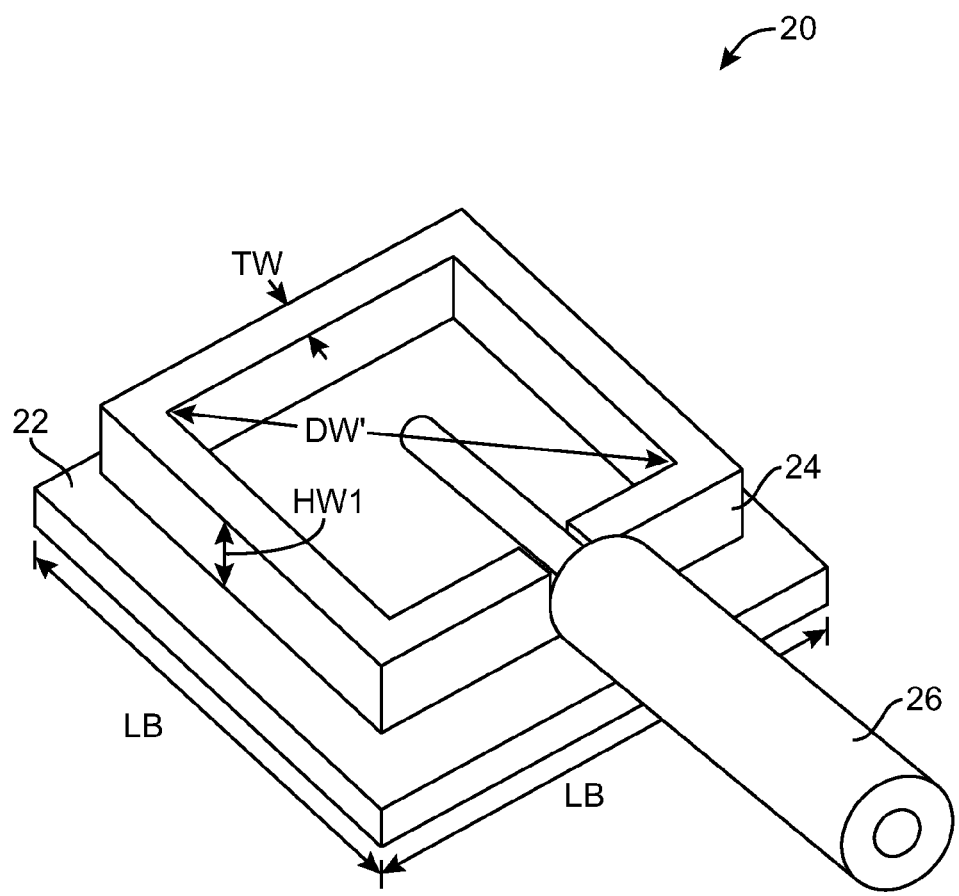
FIG. 2 is a perspective view of an illustrative solder containment bracket in accordance with an embodiment of the present invention.

Alternatively, solder containment bracket 20 may have a square wall 24, as shown in FIG. 2. Base 22 may still have the same dimensions of LB on each side. Base 22 may have a square base hole with a diagonal DW'. The base hole may be rectangular or any polygonal shape, if desired.

Square wall 24 may form a dam-like structure surrounding the square base hole. The shape of wall 24 should correspond to the shape of the hole of base 22. In this example, wall 24 forms a square dam that may have a diagonal DW'. Wall 22 may extend perpendicularly upwards from the plane of base 22 by a wall height HW1. Wall 24 may have a wall thickness TW. Wall 24 may be formed within the borders of base 22. Regardless of the shape of the wall, wall 22 may have an opening or notch to allow an electrical terminal of stripped wire 26 to be inserted. The shape of the wall should be a regular shape (e.g., circular or rectangular) for manufacturability. Solder may be deposited within the region surrounded by wall 24 to form an electrical connection between wire 26 and bracket 20.

Figure 3A:
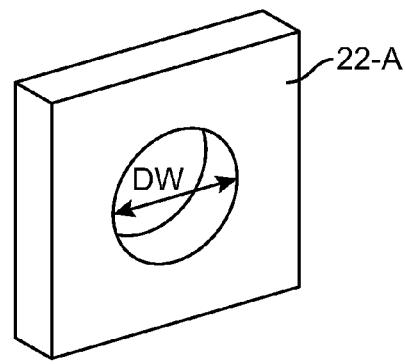
FIGS. 3A, 3B, and 3C are bottom perspective views of illustrative bases for a solder containment bracket of the type shown in FIGS. 1 and 2 in accordance with an embodiment of the present invention.
Figure 3B:
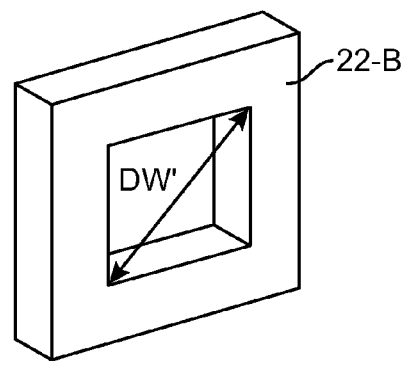
Figure 3C:
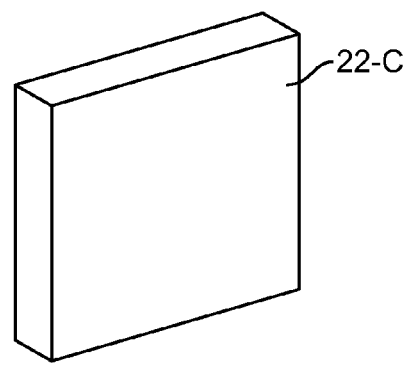

Base 22 may have various configurations, as shown from the bottom perspective views in FIGS. 3A-C. The outline of base 22 may be square. Base 22-A shown in FIG. 3A may correspond to the base described in connection with FIG. 1. The hole of base 22-A corresponds to circular wall 24 that has diameter DW. Base 22-B shown in FIG. 3B may correspond to the base described in connection with FIG. 2. The hole of base 22-B may correspond to square wall 24 that has diagonal DW'. In general, the shape of the hole in base 22 may correspond to the shape of wall 24 that protrudes upwards from the base. The hole in base 22 may be optional. Base 22-C may not have a hole, as shown in FIG. 3C. Base 22-C that does not have a hole may be used as the base for wall 24 that may have any desired shape (e.g., circular, square, rectangular, etc.).

Figure 4A:
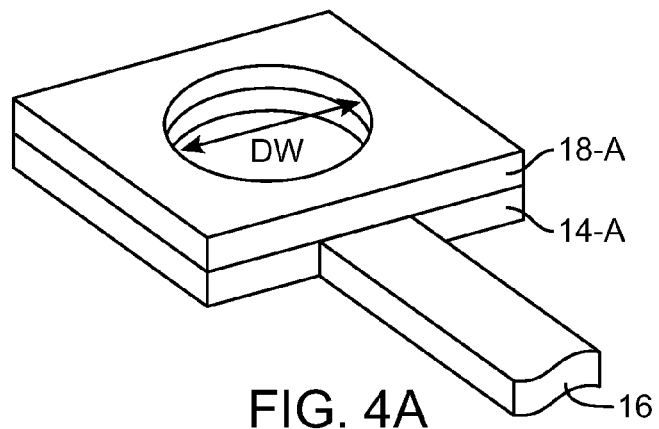
FIGS. 4A, 4B, and 4C are perspective views of illustrative land patterns for a solder containment bracket of the type shown in FIGS. 1 and 2 in accordance with an embodiment of the present invention.
Figure 4B:
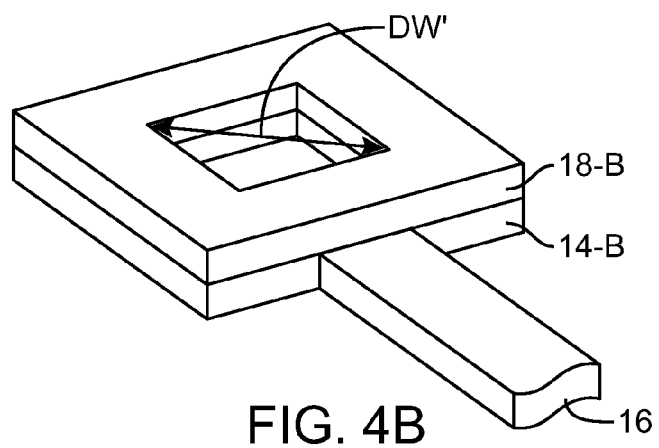
Figure 4C:
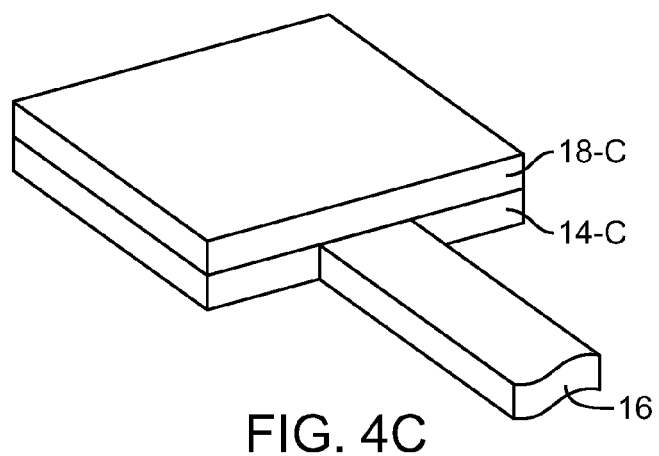

The land pattern for solder containment bracket 20 may have a shape that corresponds to the configuration of base 22. The area of the top surface of the land pattern may be greater than the area of the bottom surface of base 22. The land pattern (e.g., combination of solder pad 14-A and solder paste 18-A) shown in FIG. 4A may have a circular hole with diameter DW and may be the land pattern on which bracket 20 with base 22-A is placed. The land pattern (e.g., combination of solder pad 14-B and solder paste 18-B) shown in FIG. 4B may have a square hole with diagonal DW' and may be the land pattern on which bracket 20 with base 22-B is placed. The hole in the land pattern may correspond to the hole in bracket 20 and may be aligned when bracket 20 is placed on top of the landing pattern. The land pattern (e.g., combination of solder pad 14-C and solder paste 18-C) shown in FIG. 4C may have no hole and may be the land pattern on which bracket 20 with base 22-C is placed.

Figure 5A:
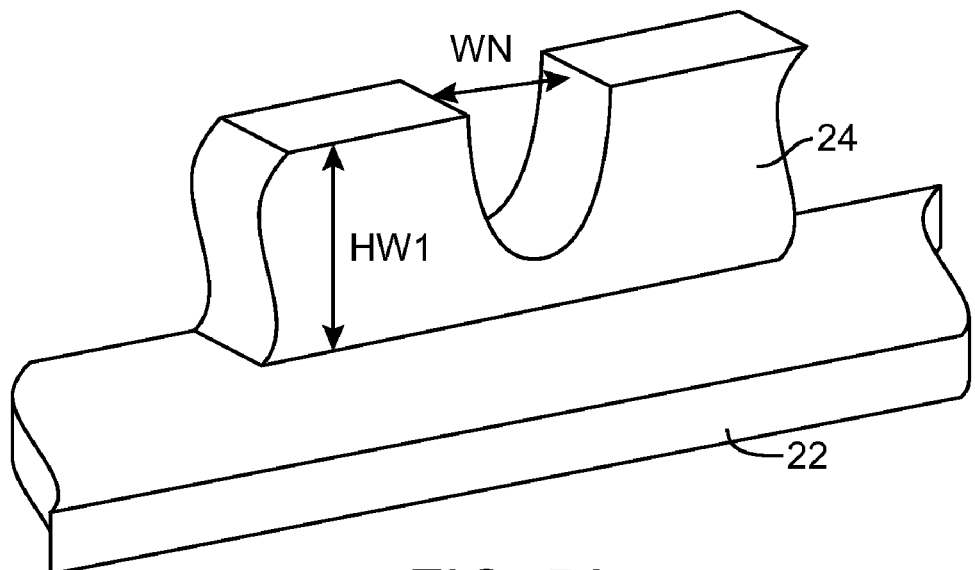
FIGS. 5A and 5B are perspective views of illustrative openings in a wall of a solder containment bracket of the type shown in FIGS. 1 and 2 in accordance with an embodiment of the present invention.
Figure 5B:
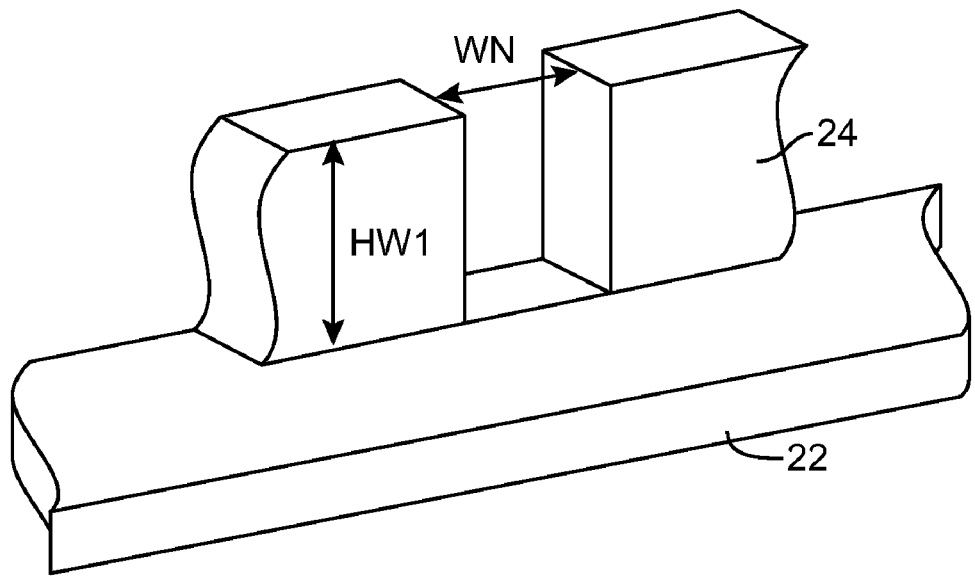

The shape of the opening in wall 24 may vary, as shown in FIGS. 5A and 5B. The opening may be a curved notch with a width WN that may not extend all the way down to base 22, as shown in FIG. 5A. Width WN may be greater than wire core diameter DS and may even be greater than entire wire diameter DB, if desired. The opening may be a rectangular notch with width WN that may extend all the way down to base 22, as shown in FIG. 5B. Wall 24 used in these wall configurations may have wall height HW1 described in connection with FIG. 1. Wall 24 shown in FIGS. 5A and 5B is merely an illustrative cutout. Wall 24 may be curved if used in a circular wall, for example.

Figure 6:
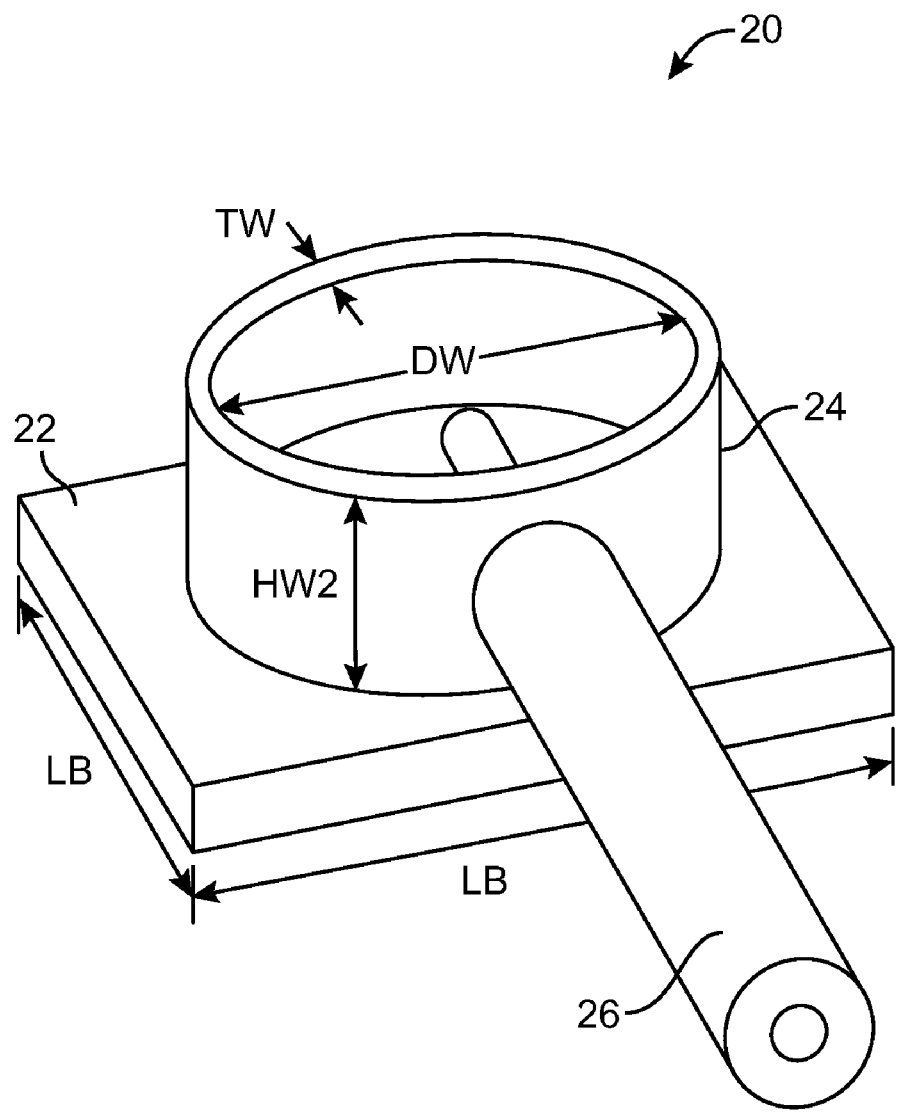
FIG. 6 is a perspective view of an illustrative solder containment bracket in accordance with an embodiment of the present invention.

Solder containment bracket 20 described in connection with FIG. 1 may be modified to have wall 24 with a wall height HW2 that may be greater than HW1, as shown in FIG. 6. In this configuration, the opening in wall 24 may be a wire hole (e.g., having a through-hole configuration) instead of a notch. Wire 26 may be inserted into the wire hole. The wire hole may provide more mechanical support for wire 26 but may be more difficult to assemble in terms of inserting a wire into the wire hole.

Figure 7A:
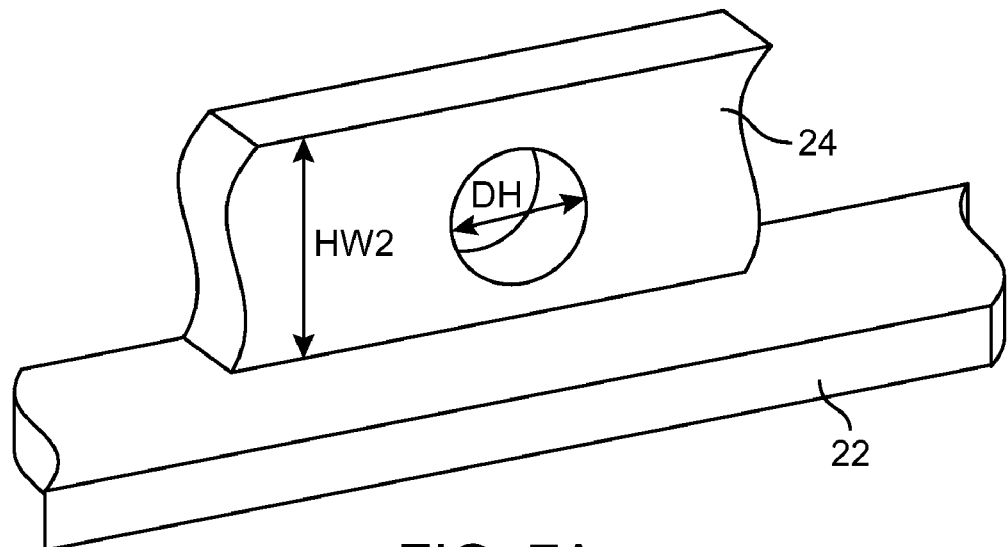
FIGS. 7A and 7B are perspective views of illustrative openings in a wall of a solder containment bracket of the type shown in FIG. 6 in accordance with an embodiment of the present invention.
Figure 7B:
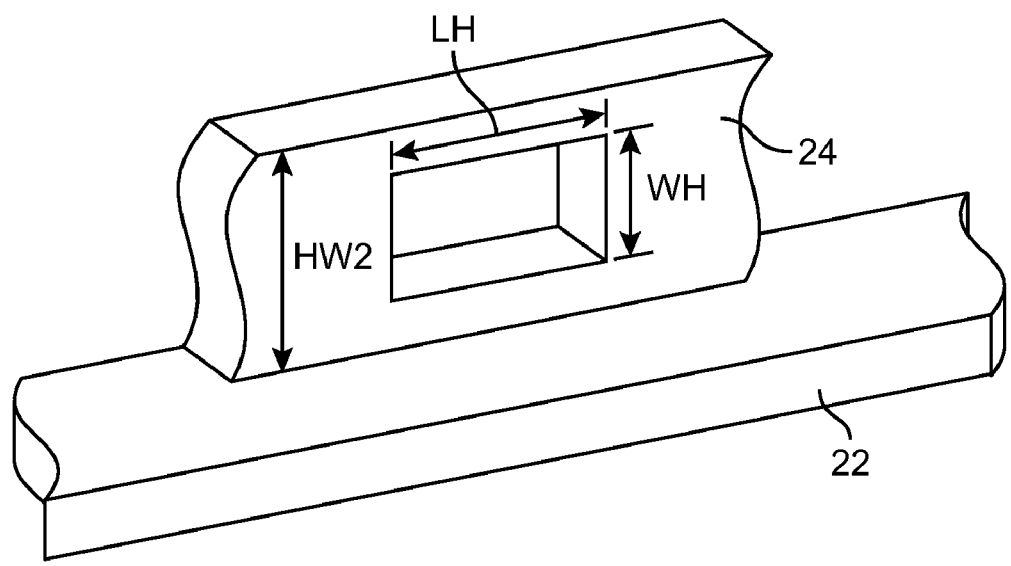

The shape of the wire hole in wall 24 may vary, as shown in FIGS. 7A and 7B. The wire hole may be a circular hole with a diameter DH that is less than wall height HW2, as shown in FIG. 7A. Diameter DH may be greater than wire core diameter DS and may even be greater than entire wire diameter DB, if desired. The wire hole may be a rectangular hole (or square, if desired) with a length LH and a width WH, as shown in FIG. 7B. Width WH may be less than wall height HW2. Length LH and width WH may each be greater than wire core diameter DS and may each be greater than entire wire diameter DB, if desired.

Figure 8:
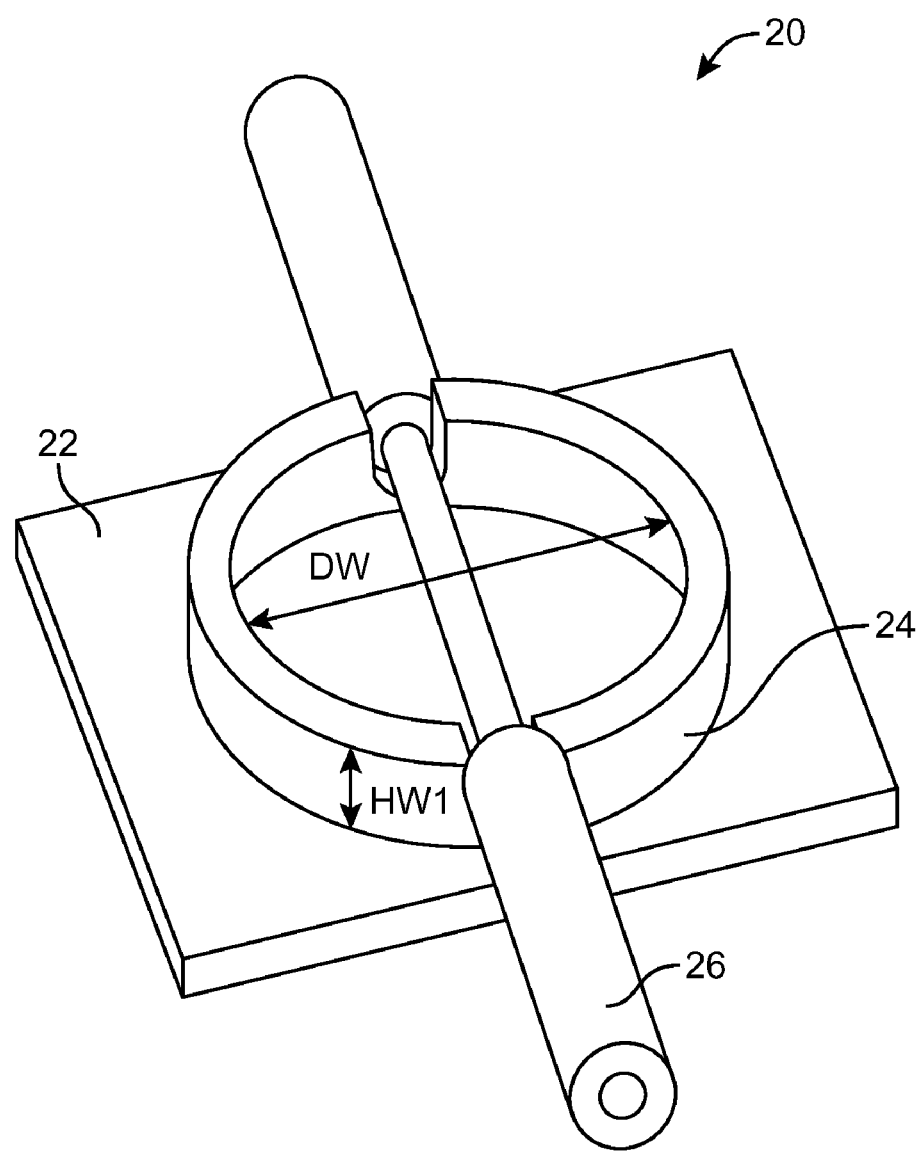
FIGS. 8 and 9 are perspective views of illustrative solder containment brackets with two aligned openings in accordance with an embodiment of the present invention.

Solder containment bracket 20 described in connection with FIG. 1 may be modified to have two aligned openings. The two openings may be any notch shape and may be aligned for insertion of a single wire 26, as shown in FIG. 8. Wire 26 may have a segment that is stripped to expose the inner conductive core, and the stripped segment may be placed within the enclosed region surrounded by wall 24. An electrical connection formed using this configuration provides a tap point to a wire instead of a termination point.

Figure 9:
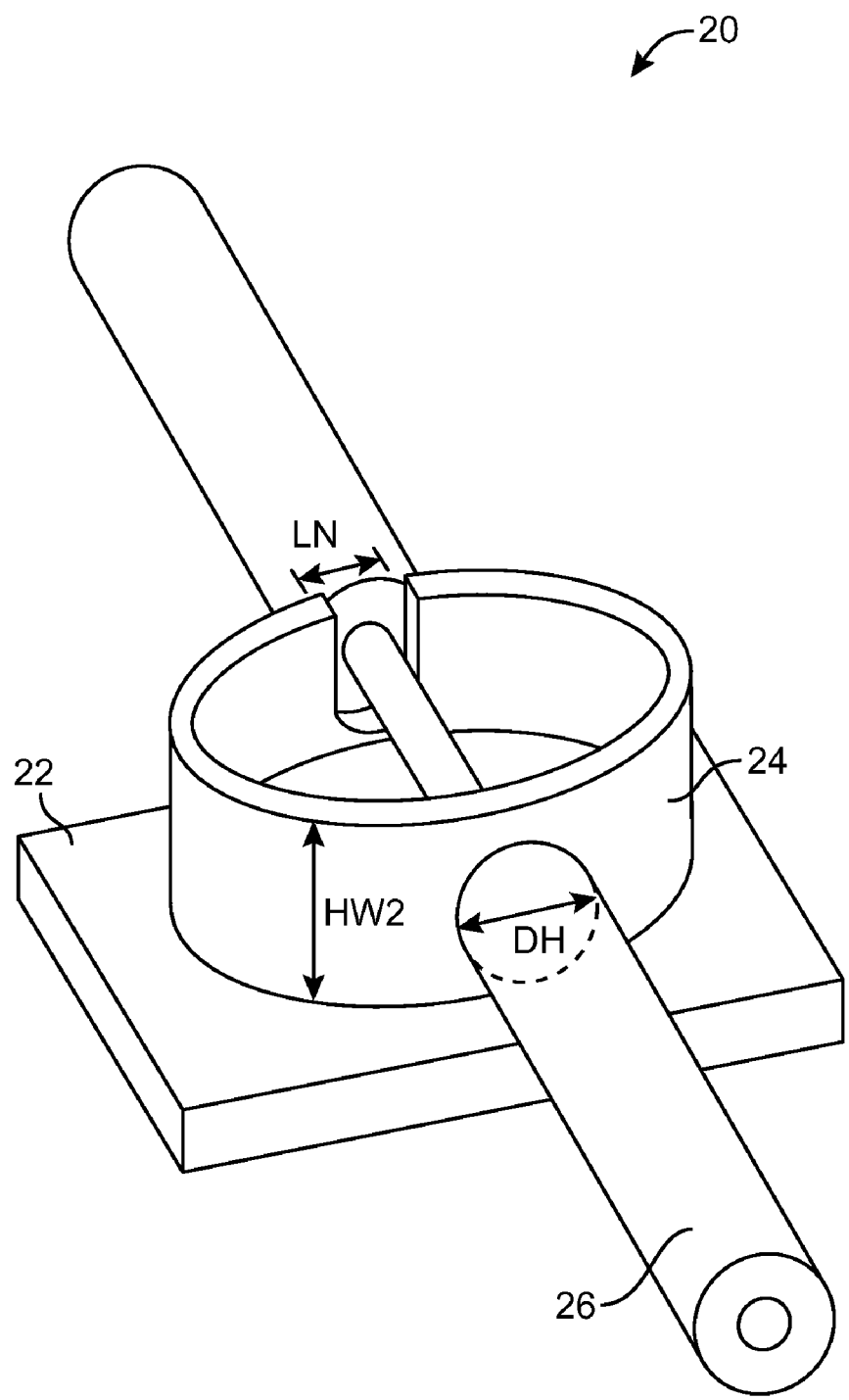

Solder containment bracket 20 described in connection with FIG. 6 may likewise be modified to have two openings. The two openings may be any notch shape or wire hole and may be aligned for insertion of a single wire 26, as shown in FIG. 9. The two aligned openings may not be the same shape and may not be the same type of opening (e.g., one opening may be a wire hole and the other opening may be a notch). The notch type opening may improve the ease of insertion at the price of reduced mechanical support for wire 26.

Figure 10:
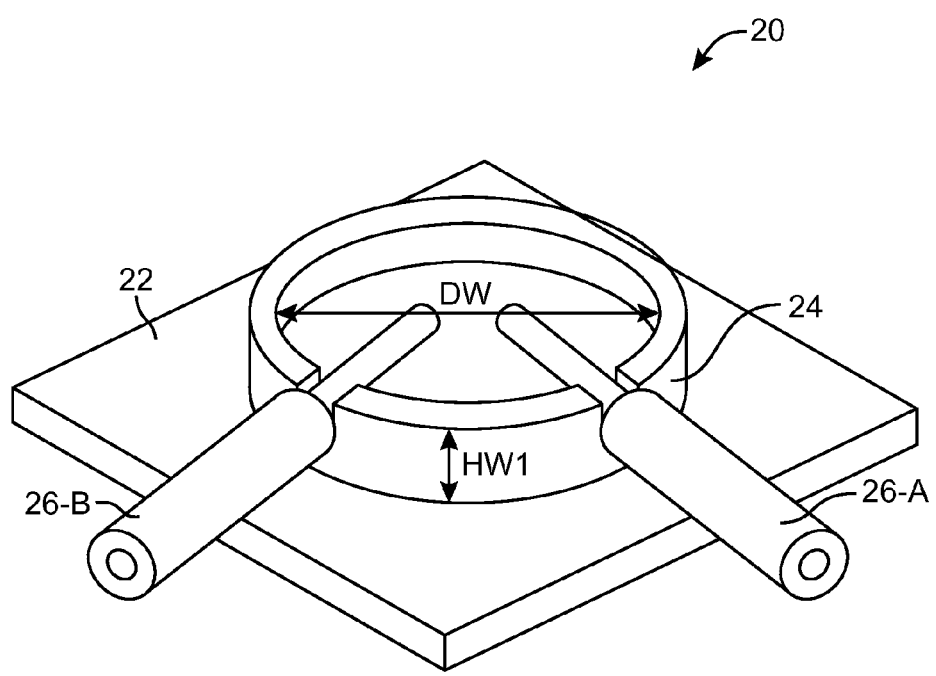
FIG. 10 is a perspective view of an illustrative solder containment bracket of a type that can accommodate multiple wires in accordance with an embodiment of the present invention.

Solder containment bracket 20 described in connection with FIG. 1 may be modified to have multiple openings for insertion of multiple wires. FIG. 10 shows the insertion of two wires (e.g., wires 26A and 26B) in two separate openings in wall 24. The multiple openings may not have to be aligned because they are used as insertion points for separate wires. Any number of openings may be used to provide insertion openings for any number of wires using this configuration. Bracket 20 with multiple openings may be further modified as described previously to have any shape desired or to provide improved mechanical support for the inserted wires.

Figure 11:
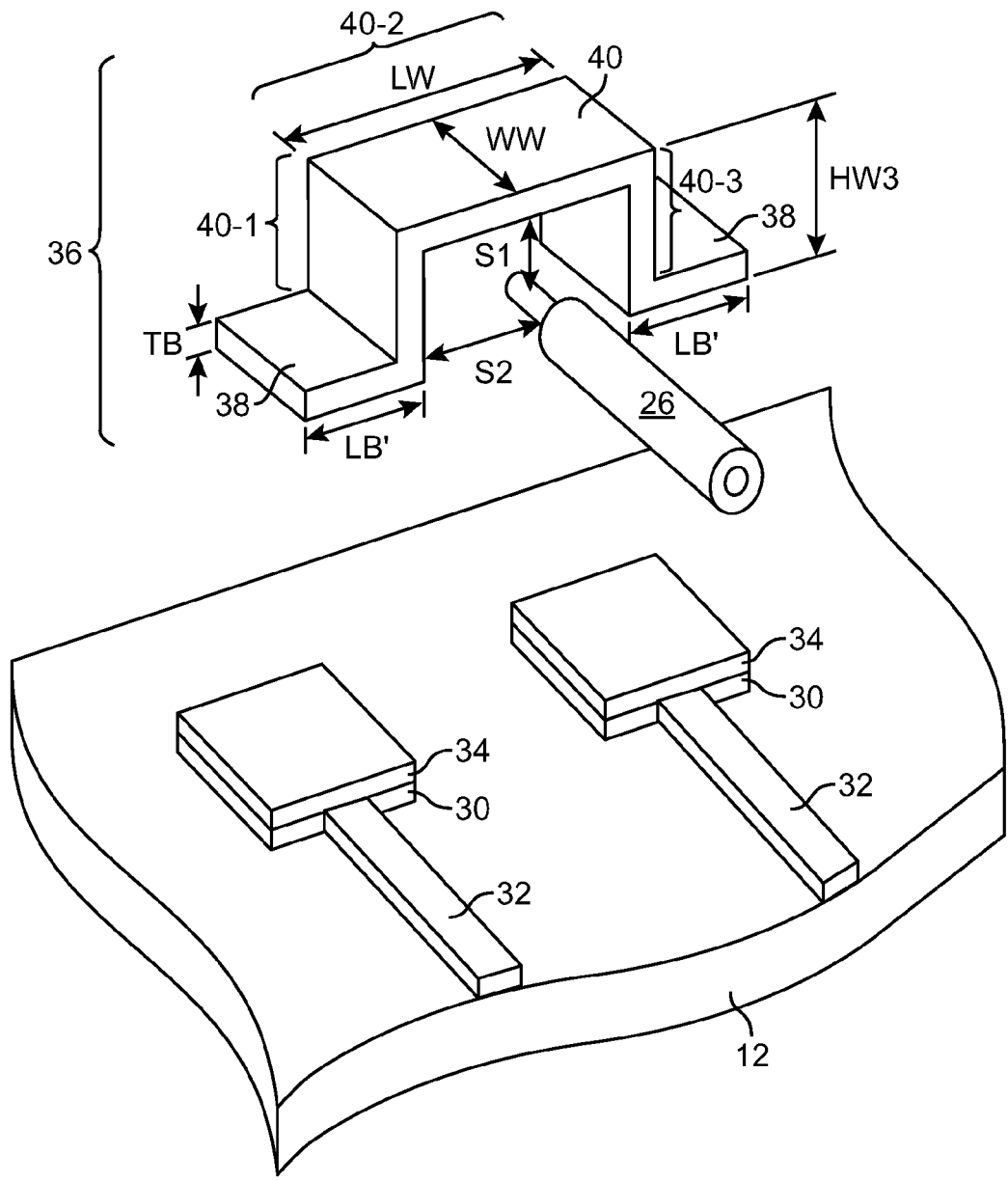
FIG. 11 is a perspective view of an illustrative solder containment bracket formed from a U-shaped metal structure that forms electrical connections to two corresponding solder pads on the surface of a printed circuit board in accordance with an embodiment of the present invention.

The solder containment bracket may be modified to control the height of the solder joint instead of the area of the solder joint (e.g., see, solder containment bracket 36 of FIG. 11). Bracket 36 may have first and second bases 38 each having a base length LB' and a base width WW. Bases 38 may be rectangular (or square, if desired) and may be identical in size. Wall 40 may connect bases 38. Wall 40 may have a first portion 40-1 that extends upwards from the first base, a second portion 40-2 that extends parallel to bases 38, and a third portion 40-3 that extends downwards towards the second base and connects to the second base. Second portion 40-2 may have a wall length LW and width WW. First and third portions 40-1 and 40-3 may have a length HW3, which may be the height of solder containment bracket 36.

Bracket 36 may formed from be a thin piece of metal with a uniform thickness TB. For example, thickness TB may be 0.15 millimeters (mm). Bracket 36 may be formed from stainless steel, copper, brilliant copper, or any suitable metal that can be easily plated. Bracket 36 may be plated with tin-lead, silver, or gold.

Solder containment bracket 36 may be attached to circuit board 12 through first and second land patterns. First and second land patterns each include solder pad 30 and solder paste 34 that is formed on top of solder pad 30. Solder pad 30 and solder paste 34 are formed using the same materials as solder pad 14 and solder paste 18 described previously in connection with FIG. 1. First and second electrical traces 32 may be formed on circuit board 12 to connect solder pad 30 to terminals of other electrical components.

The first and second land patterns may each have a top surface area that is larger than a respective bottom surface area of first and second bases 38. The first and second land patterns may provide a landing to which solder containment bracket 36 may be aligned and bracket 36 may be placed on.

Wire 26 may be inserted into a region under wall (e.g., region surrounded by portions 40-1, 40-2, and 40-3). Wire 26 may be stripped to expose an inner conductive core that may be placed directly under wall 40. Wire 26 may be placed a spacing S1 away from second portion 40-2 and may be placed between first and third portions 40-1 and 40-3 (e.g., with spacing S2 away from each portion). For example, spacing S1 and S2 may be at least 0.1 mm to provide space for solder to join wire 26 to bracket 36.

Wall 40 of bracket 36 may provide improved control of solder flow and control of the height of the solder joint (e.g., solder is well controlled within the confines of wall 40 in the Z direction that is perpendicular to the surface of circuit board 12). A well-managed solder joint using bracket 40 may provide a more reliable electrical connection and may be smaller than a through-hole wire connection that is used in conventional through-hole technology.

Figure 12A:
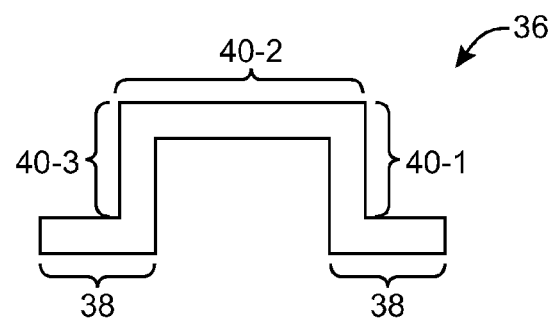
FIGS. 12A, 12B, and 12C are side views of illustrative solder containment brackets of the type shown in FIG. 11 in accordance with an embodiment of the present invention.
Figure 12B:
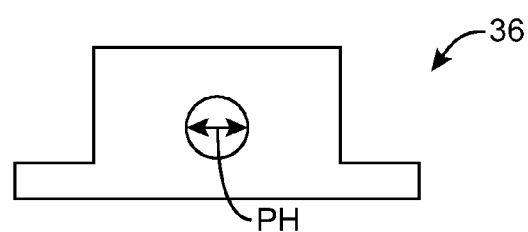
Figure 12C:
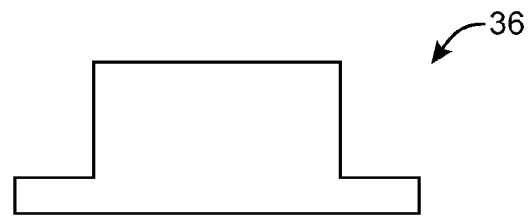

Solder containment bracket 36 may be modified to further control the area of the solder joint and to provide mechanical support for wire 26. FIGS. 12A-12C show the rear views of possible configurations for bracket 36. FIG. 12A shows the rear view of solder containment bracket 36 described in connection with FIG. 11. Alternatively, bracket 36 may have a solid back wall that may have thickness TB and that may have a wire hole. The wire hole may have a diameter DH that is less than wall height HW3, as shown in FIG. 12B. Diameter DH may be greater than wire core diameter DS and may even be greater than entire wire diameter DB, if desired. Wire 26 may be inserted into the wire hole for additional mechanical support, if desired. Bracket 36 may have a solid back wall that may have thickness TB but may not have a wire hole, as shown in FIG. 12C. The back wall shown in FIGS. 12B and 12C may further provide control for the area of the solder joint.

Figure 13:
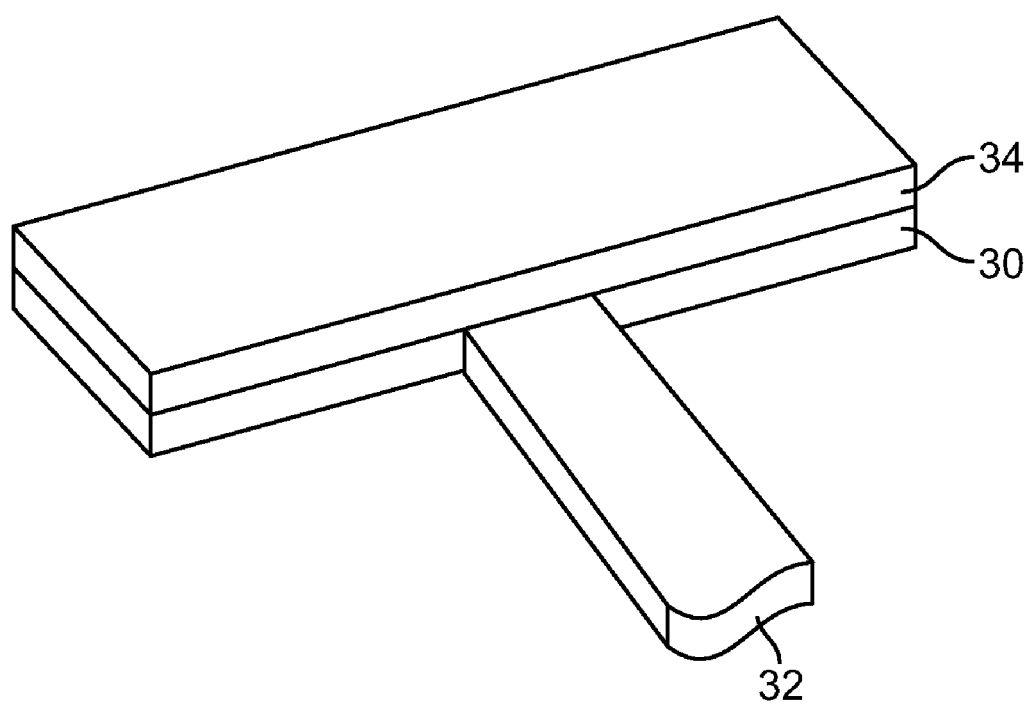
FIG. 13 is a perspective view of an illustrative land pattern with a unitary solder pad shape for receiving a solder containment bracket of the type shown in FIG. 11 in accordance with an embodiment of the present invention.

The first and second land patterns may not have to be separated. The first and second land patterns may be merged to form a single land pattern for solder containment bracket 36, as shown in FIG. 13. In this configuration, only one trace 32 connecting with solder pad 30 may be needed for electrical routing. The single land pattern may be long and wide enough such that bracket 36 may fit within the borders of the single land pattern.

The figures (see, e.g., FIGS. 1 and 11) showing the mounting of a component on the top surface using the surface-mount technology are merely illustrative. The same techniques and materials may be applied and attached respectively to the bottom surface of circuit board 12. Because of the absence of through-holes in the circuit board, electrical components may be placed directly mirrored from one another (e.g., one component may be placed on the top surface and another component may be placed on the bottom surface that is directly below the top surface).

Figure 14:
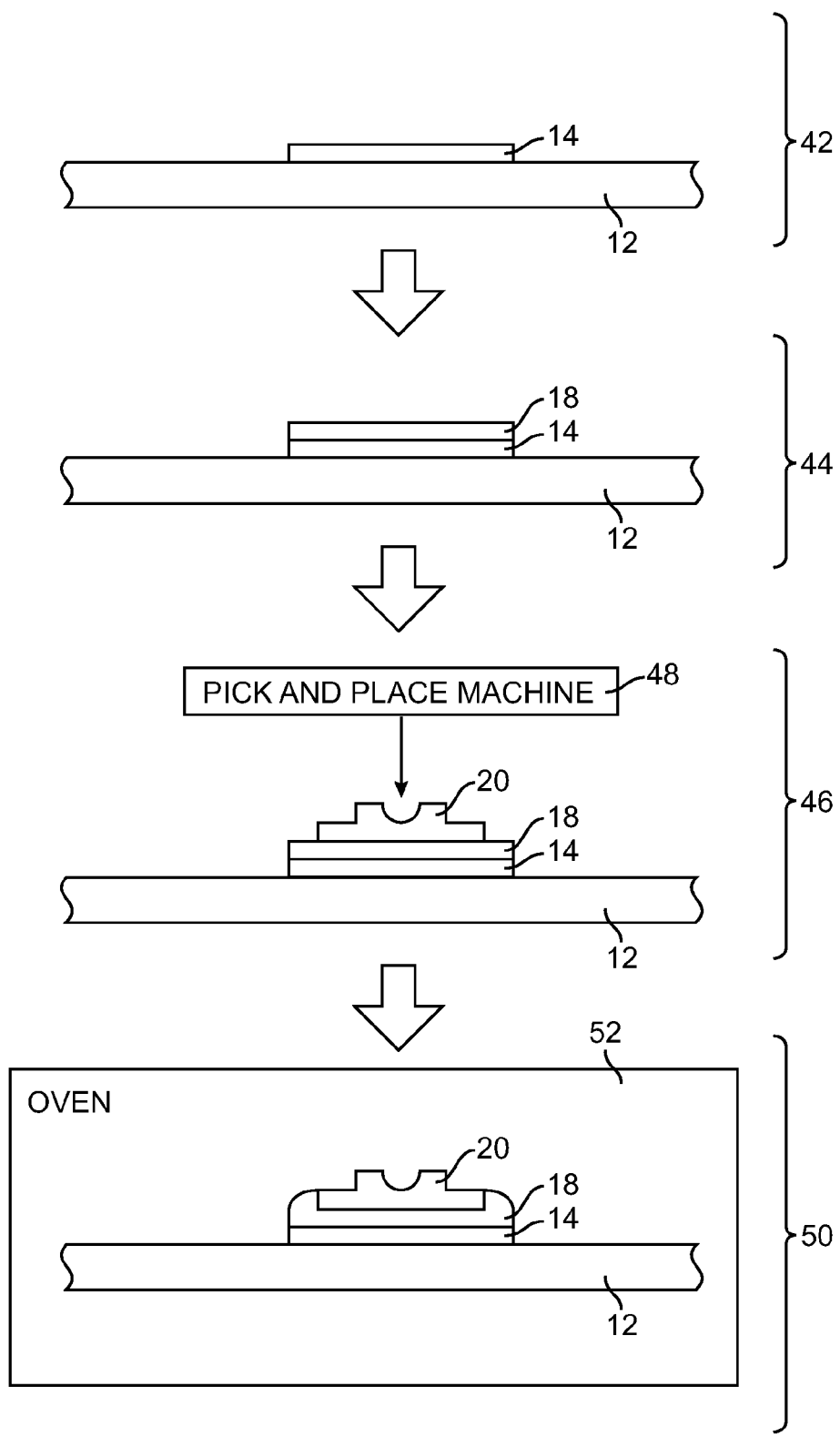
FIG. 14 is a diagram showing how an electrical assembly of the type shown in FIG. 1 may be constructed in accordance with an embodiment of the present invention.
Figure 14:
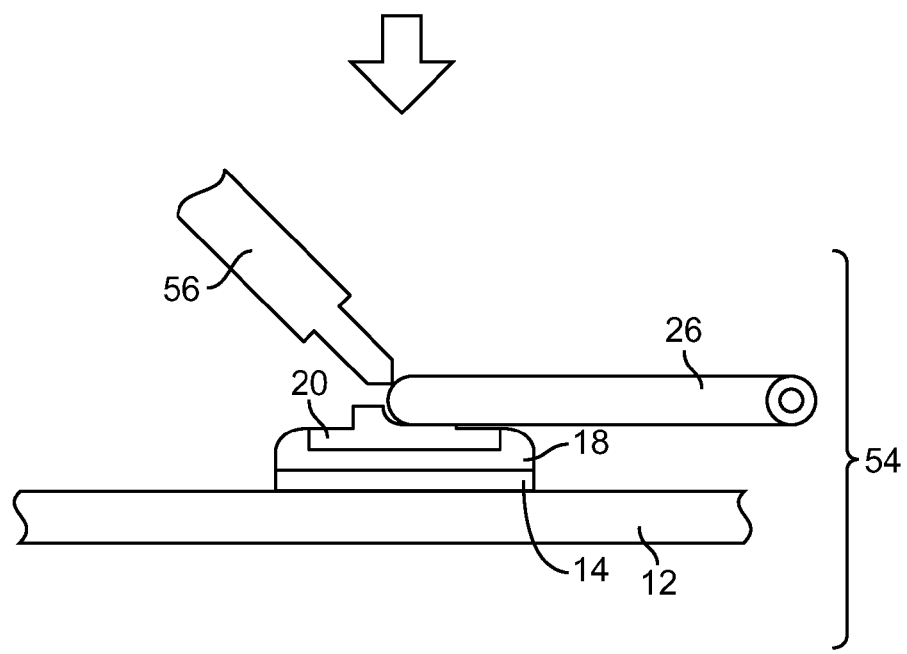
Figure 14:
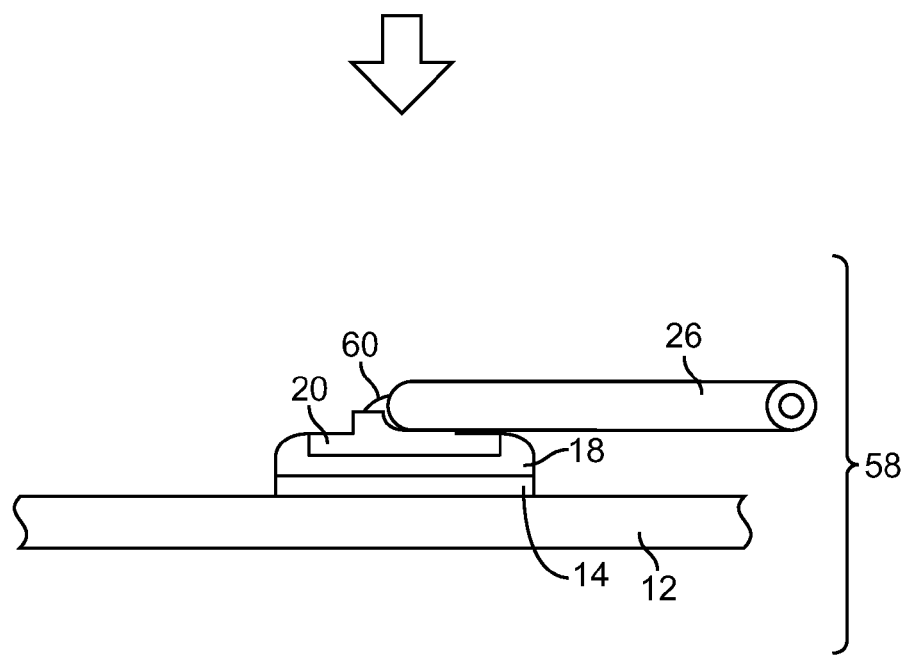
Figure 15:
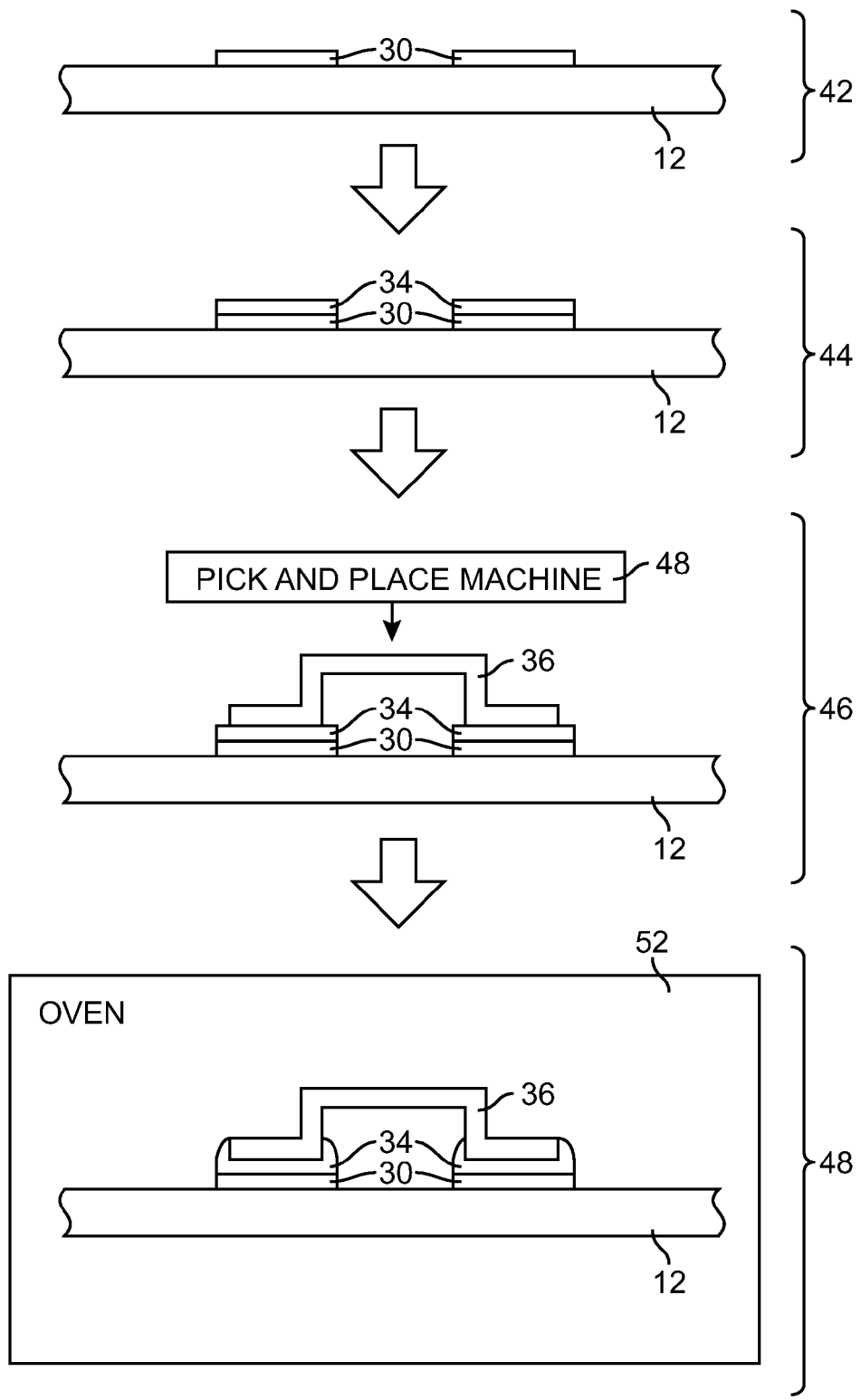
FIG. 15 is a diagram showing how an electrical assembly of the type shown in FIG. 11 may be constructed in accordance with an embodiment of the present invention.
Figure 15:
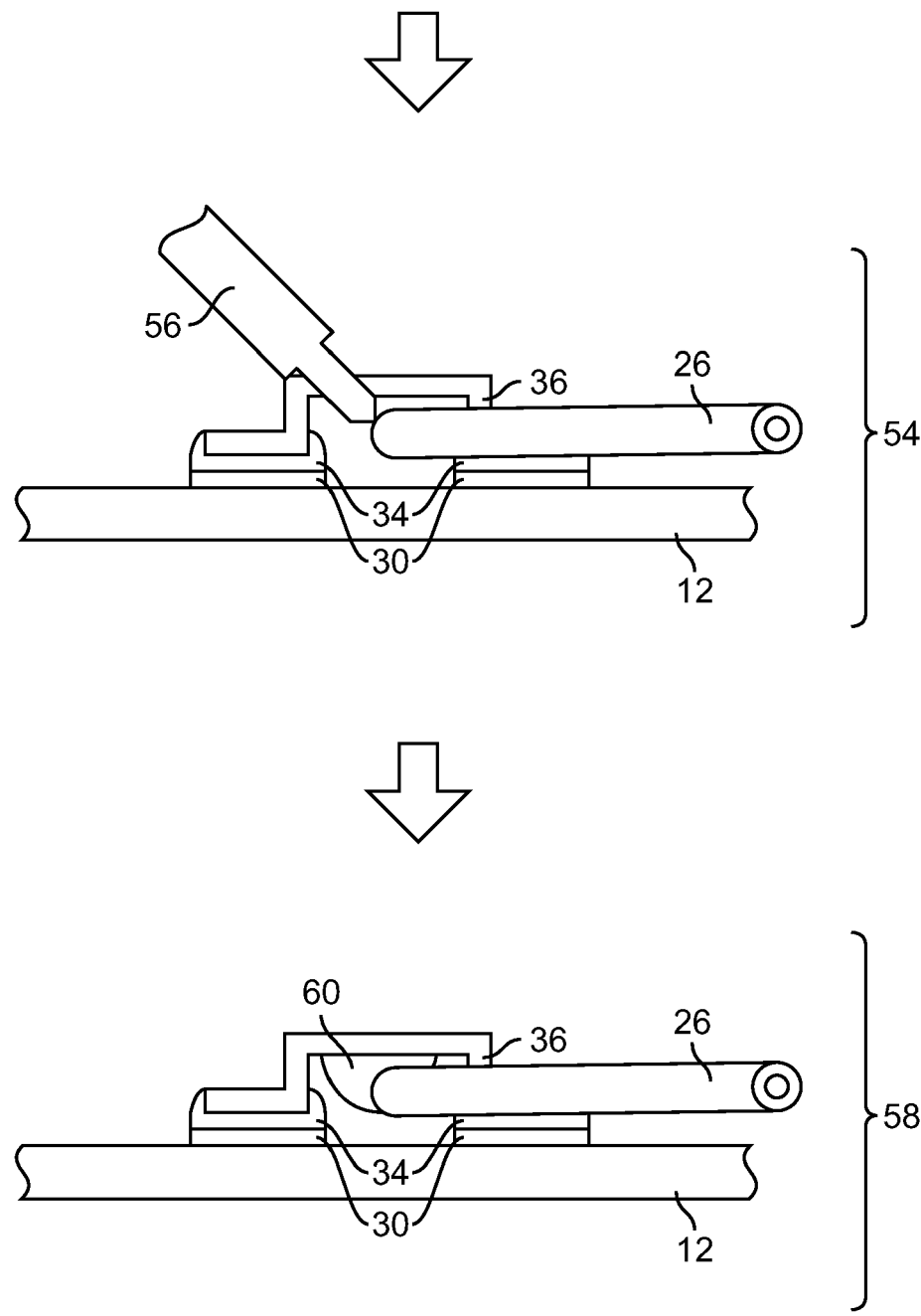

FIGS. 14 and 15 show the steps involved in building electronic assembly 10. The steps of FIGS. 14 and 15 are identical except that FIG. 14 illustrates the attachment of solder containment bracket 20 to circuit board 12 while FIG. 15 shows the attachment of solder containment bracket 36 to circuit board 12.

At step 42, the solder pad may be formed on circuit board 12. Trace 36 (not shown) that connects to the solder pad may be formed during this step. Any area on circuit board 12 that is not a solder pad, trace, or metal sheet may be covered by solder resist coating that prevents solder from adhering to undesired areas on circuit board 12.

Solder paste may be deposited on top of the solder pad using a screen printing process (step 44) to form a land pattern. The solder paste may provide a sticky surface to which SMT components may temporarily stick.

After screen printing, circuit board 12 may be placed on a conveyor belt. SMT components such as the solder containment bracket (e.g., bracket 20 or bracket 36) may be delivered to the production line in either paper or plastic tapes wound on reels or plastic tubes. A numerically controlled pick and place machine 48 may be used to remove the bracket from the tapes and may be used to place the bracket on circuit board 12 on the corresponding land pattern (step 46).

Circuit board 12 may be place into a reflow soldering oven 52 during step 50. Oven 52 may be raised to a reflow temperature that is high enough to melt the solder particles in the solder paste, thereby forming a solder joint that bonds (solders) the metal bracket to the solder pad on circuit board 12. The surface tension of the molten solder may keep the bracket in place and may automatically align the bracket to the solder pad. Any type of reflow soldering may be used, such as infrared reflow, hot gas convection reflow, vapor phase reflow, or other suitable reflow techniques that can melt the solder paste to electrically connect the solder containment bracket to the solder pad. After reflow, circuit board 12 may be washed or cleaned to remove flux residues or any stray solder balls that may undesirably short out closely spaced solder pads. This cleaning process may not be used to save the cost of cleaning, to speed up the production process, and to reduce waste.

Wire 26 may be stripped to form a bare wire segment. The bare wire segment may be inserted into a region enclosed by the wall of the bracket. Wire 26 may be inserted manually or by using any type of alignment jig that may hold the wire in place. Soldering operations may be performed using hand tools (one joint at a time) or en masse on a production line. Hand tools, such as soldering gun 56, soldering iron, torch, hot-air pencil, or any suitable tool may be used to solder wire 26 to the bracket (step 54). The soldering operation performed in step 54 may melt solder with a soldering temperature that may be less than the temperature of the reflow temperature. The soldering temperature may be below 400 degrees Celsius, for example. Using a lower temperature for soldering may prevent melting the solder paste (e.g., the solder in the solder paste may have a higher melting point than the solder used to join the wire to the bracket) that connects the bracket to the solder pad. If the land pattern has a hole corresponding to the base hole of the bracket, solder applied during step 54 may not directly bond to the solder pad. During step 54, molten solder may be drawn into the joint (e.g., that connects the wire to the bracket) by capillary action and may bond to the metals to be joined by wetting action. Solder used in this step may contain copper, silver, gold, iron, nickel, or any other metal that is suitable for soldering.

At step 58, a reliable solder joint has been formed between the solder containment bracket and the wire. FIGS. 14 and 15 show solder 60 formed within the region surrounded by the bracket wall. The solder joint formed inside the bracket may have well-controlled solder height or area and may provide a more reliable electrical connection.

FIGS. 1 and 11 are merely illustrative. If desired, the solder containment bracket may be modified to provide any electronic component (discrete components, integrated circuits, etc.) with improved solder joints.

The foregoing is merely illustrative of the principles of this invention and various modifications can be made by those skilled in the art without departing from the scope and spirit of the invention.

What is claimed is:

1. Apparatus, comprising:
   a substrate having a surface;
   a solder pad structure formed on the surface of the substrate;
   a solder containment bracket having a base and a wall, wherein the base is mounted to the solder pad structure, wherein the wall protrudes upwards from the base, wherein the wall surrounds an enclosed solder region, and wherein the wall has an opening for receiving a wire; and
   solder in the enclosed solder region that forms a solder joint between the wire and the solder containment bracket.

2. The apparatus defined in claim 1 wherein the solder pad structure comprises a solder pad having a hole below the enclosed solder region.

3. The apparatus defined in claim 1 wherein the solder pad structure comprises a rectangular trace without a hole below the enclosed solder region.

4. The apparatus defined in claim 1 wherein the base is rectangular and wherein the wall forms a cylindrical containment structure that surrounds the enclosed solder region.

5. The apparatus defined in claim 1 wherein the wall extends vertically from the base, the apparatus further comprising an additional opening in the wall.

6. The apparatus defined in claim 1 further comprising a layer of solder that connects the base to the solder pad structure.

7. The apparatus defined in claim 1 wherein the solder containment bracket comprises a solder containment bracket that is soldered to the solder pad structure at a reflow temperature and wherein the wire comprises a wire that is soldered within the enclosed solder region at a soldering temperature that is less than the reflow temperature.

8. Apparatus, comprising:
   a substrate having a surface;
   at least first and second contact pad regions formed on the surface of the substrate;
   a solder containment bracket having first and second bases;
   a layer of solder under the first and second bases that solders the first and second bases to the first and second contact pad regions respectively, wherein the solder containment bracket has portions that enclose a region above the substrate surface;
   a wire in the region; and
   a solder joint that solders the wire in the region to the solder containment bracket.

9. The apparatus defined in claim 8 wherein the substrate comprises a printed circuit board.

10. The apparatus defined in claim 9 wherein the wire comprises a battery lead and wherein the printed circuit board comprises a rigid printed circuit board.

11. The apparatus defined in claim 8 wherein the layer of solder under the first and second bases of the solder containment bracket is soldered to the first and second contact pad regions at a reflow temperature and wherein the wire is soldered to the solder containment bracket at the solder joint at a solder temperature that is less than the reflow temperature.

12. The apparatus defined in claim 8 wherein the at least first and second contact pad regions comprise one continuous contact region on the surface of the substrate.

* * * * *